United States Patent
Ajika et al.

(10) Patent No.: US 7,924,615 B2
(45) Date of Patent: Apr. 12, 2011

(54) NONVOLATILE SEMICONDUCTOR MEMORY DEVICE

(75) Inventors: Natsuo Ajika, Amagasaki (JP); Shoji Shukuri, Hyogo (JP); Masaaki Mihara, Hyogo (JP); Yoshiki Kawajiri, Hyogo (JP)

(73) Assignee: Genusion, Inc., Hyogo (JP)

( * ) Notice: Subject to any disclaimer, the term of this patent is extended or adjusted under 35 U.S.C. 154(b) by 0 days.

(21) Appl. No.: 12/714,750

(22) Filed: Mar. 1, 2010

(65) Prior Publication Data
US 2010/0149875 A1 Jun. 17, 2010

Related U.S. Application Data

(63) Continuation of application No. 11/684,035, filed on Mar. 9, 2007, now Pat. No. 7,701,778.

(30) Foreign Application Priority Data

Mar. 10, 2006 (JP) ................................ P2006-066627

(51) Int. Cl.
*G11C 11/34* (2006.01)

(52) U.S. Cl. .......... 365/185.11; 365/185.17; 365/185.13

(58) Field of Classification Search ............ 365/185.11, 365/185.17, 185.13, 230.03, 63, 185.2, 185.29, 365/230.06, 189.05, 185.23, 185.22, 185.18
See application file for complete search history.

(56) References Cited

U.S. PATENT DOCUMENTS

| 2002/0008992 A1* | 1/2002 | Tanaka et al. ............ 365/185.13 |
| 2003/0123272 A1* | 7/2003 | Kang et al. ..................... 365/63 |

* cited by examiner

*Primary Examiner* — Dang T Nguyen
(74) *Attorney, Agent, or Firm* — The Marbury Law Group PLLC

(57) ABSTRACT

The present invention relates to a nonvolatile semiconductor memory, and more specifically relates to a nonvolatile semiconductor memory with increased program throughput. The present invention provides a nonvolatile semiconductor memory device with a plurality of block source lines corresponding to the memory blocks, arranged in parallel to the word lines, a plurality of global source lines arranged in perpendicular to the block source lines; and a plurality of switches for selectively connecting corresponding ones of the block source lines and the global source lines.

12 Claims, 10 Drawing Sheets

… (1)

NONVOLATILE SEMICONDUCTOR MEMORY DEVICE

CROSS REFERENCE TO RELATED APPLICATIONS

This application is a continuation of U.S. patent application Ser. No. 11/684,035 entitled "Nonvolatile Semiconductor Memory Device" filed Mar. 9, 2007, which is based upon and claims the benefit of priority from the prior Japanese Patent Application No. 2006-66627, the entire contents of both of which are incorporated herein by reference.

FIELD OF THE INVENTION

The present invention relates to a nonvolatile semiconductor memory, and more specifically relates to a nonvolatile semiconductor memory with increased program throughput.

BACKGROUND OF THE INVENTION

Recently, capacities of flash memories for code storages with random access capability during reading are increased, which leads to a demand for increased throughput during programming.

In conventional type flash memories for code storages (NOR type flash memories), programming time per one bit is about 10 µsec, programming current per one bit is about 100 µA at 5 Volts. When 8-32 bits are simultaneously programmed, a throughput of 8-32 bits/10 µsec=100 k-400 kbytes/sec is realized. The required programming current is about 800 µA-3.2 mA. The power source of about 5 Volts for supplying the programming current is stepped up from the external power source of 1.8 Volts on chip, which leads to a difficulty in supplying a large current and in improvement of the throughput by increasing a number of bits programmed simultaneously. Furthermore, power consumption during programming limits the improvement of the throughputs.

In the contrary, conventional type flash memories for data storages (NAND type flash memories), programming time per one bit is about 1 msec, programming current per one bit is less than 1 pA. When about 8 kbytes are simultaneously programmed, a throughput of 8 Mbytes/sec is realized. In order to program 8 k bytes simultaneously, the flash memories for data storages have 8 kbyts of data latches (column latches), enabling data inputs and simultaneous programming of 8 kbyts.

Even for the flash memories for data storage (NAND type flash memories), the programming throughputs are 8 Mbytes/sec, which is less than one tenth (1/10) of the programming throughputs of hard disk drives (HDD) of 100 Mbites/sec. The programming throughputs of the code storage flash memories (NOR type flash memories) are still one tenth (1/10) less than that of the flash memories for data storage. Therefore, the improvements in programming throughputs are important subject matter.

WO 2004-095585 shows a programming method applicable to code storage type flash memories (NOR type flash memories) with less programming current. When this method is used, since the programming current is small, a number of bits for simultaneous programming can be increased as equivalent to NAND flash memories, enabling the programming throughputs of the code storage type flash memories to be improved drastically.

Therefore, one of the objects of this invention is to provide a nonvolatile semiconductor memory device with multiple bit verifications during program verification to enable reduced programming time. Various other object of this invention will be described hereinafter.

SUMMARY OF THE INVENTION

In one aspect of the present invention, it is provided a nonvolatile semiconductor memory device comprising: a plurality of memory blocks, each of the memory blocks having a plurality of memory cells arranged in matrix form, gate electrodes of said memory cells arranged in the same row being connected to corresponding one of word lines and drain electrodes of said memory cells arranged in the same column being connected to corresponding one of bit lines; a plurality of block source lines corresponding to said memory blocks, said block source lines arranged in parallel to said word lines, source electrodes of said memory cells being commonly connected to corresponding one of said block source line; a plurality of source line driver circuits corresponding to said block source lines, said plurality of source line driver circuits driving corresponding one of said block source lines; a plurality of global source lines arranged in perpendicular to said block source lines; and a plurality of switches for selectively connecting corresponding ones of said block source lines and said global source lines.

The nonvolatile semiconductor memory device of this invention further comprises: a plurality of source line selection control lines arranged in parallel to said word lines, the source line selection control lines for controlling said switches corresponding to selected memory block to turn on and for controlling said switches corresponding to non-selected memory block to turn off during programming or program verification.

The nonvolatile semiconductor memory device of this invention further comprises: a plurality of program verification circuits for verifying in parallel whether program operations to said memory cells are completed or not by flowing current through said memory cells toward a corresponding one of said block source lines and said global source lines.

In the nonvolatile semiconductor memory device of this invention, each of the plurality of memory blocks is formed in an independent well.

In the nonvolatile semiconductor memory device of this invention, said independent well is n-type well formed in a p-type region of a semiconductor substrate, and said plurality of memory cells are of P-type nonvolatile transistors, each of said P-type nonvolatile transistors having a charge trap layer.

In the nonvolatile semiconductor memory device of this invention, said switches are of P-type transistors.

In the nonvolatile semiconductor memory device of this invention, said switches and said memory cells are commonly back gate biased.

In the nonvolatile semiconductor memory device of this invention, said switches and said memory cells are formed in a same well.

In the nonvolatile semiconductor memory device of this invention, said plurality of memory cells are programmed by a hot electron injection while said independent well is such biased to an increased voltage that absolute values of threshold voltages of said memory cells are increased.

The nonvolatile semiconductor memory device of this invention, further comprises: a plurality of source line selection control lines arranged in parallel to said word lines, the source line selection control lines for controlling all of said switches to turn off during erasure.

In the nonvolatile semiconductor memory device of this invention, each of the plurality of memory blocks is formed in an independent well.

In the nonvolatile semiconductor memory device of this invention, said independent well is n-type well formed in a p-type region of a semiconductor substrate, and said plurality of memory cells are of P-type nonvolatile transistors, each of said P-type nonvolatile transistors having a charge trap layer.

In the nonvolatile semiconductor memory device of this invention, said switches are of P-type transistors.

In the nonvolatile semiconductor memory device of this invention, said memory cells are erased by independently changing a voltage of said independent well.

In one aspect of the present invention, it is provided a nonvolatile semiconductor memory device comprising: a plurality of main bit lines; a plurality of global source lines arranged in parallel to said main bit lines; and a plurality of blocks, each of the blocks comprising: a plurality of memory cells arranged in matrix; a plurality of word lines connected to gate electrodes of said memory cells arranged in a same row; a plurality of sub bit lines connected to drain electrodes of said memory cells arranged in a same column; a plurality of source lines arranged in parallel to said word lines, said source lines being connected to source electrodes of said memory cells in a same row; a plurality of local source lines arranged in parallel to said sub bit lines, each of said plurality of local source lines being connected to said plurality of source lines; a plurality of bit line selection transistors for selectively connecting corresponding ones of said main bit lines and said sub bit lines; and a plurality of block source selection transistors for selectively connecting corresponding ones of said global source lines and said local source lines.

In the nonvolatile semiconductor memory device of this invention, said plurality of bit line selection transistors are arranged in a first row and said plurality of block source selection transistors are arranged in a second row which is in adjacent to said first row.

In the nonvolatile semiconductor memory device of this invention, a channel width of said plurality of block source selection transistors are greater than a channel width of said plurality of bit line selection transistors.

In the nonvolatile semiconductor memory device of this invention, said plurality of bit line selection transistors are divided into a first group of selection transistors arranged at one end of said matrix and a second group of selection transistors arranged at other end of said matrix.

The nonvolatile semiconductor memory device of this invention, further comprises a dummy word line arranged between said matrix and said first or second rows In the nonvolatile semiconductor memory device of this invention, the local source lines are wired in a level higher than a level of the source lines and the global source lines are wired in a level higher than the level of the local source lines.

In the nonvolatile semiconductor memory device of this invention, the global source lines and the main bit lines are wired in a same level metal layer.

In the nonvolatile semiconductor memory device of this invention, the local source lines and the sub bit lines wired in a same level metal layer.

In the nonvolatile semiconductor memory device of this invention, each of the blocks further comprising an independent well in which said plurality of memory cells and said plurality of block source selection transistors are formed.

In the nonvolatile semiconductor memory device of this invention, said independent well is of n-type well and said memory cells are of P-type nonvolatile memory cell transistors.

DETAILED DESCRIPTION OF THE INVENTION

Figure 1:
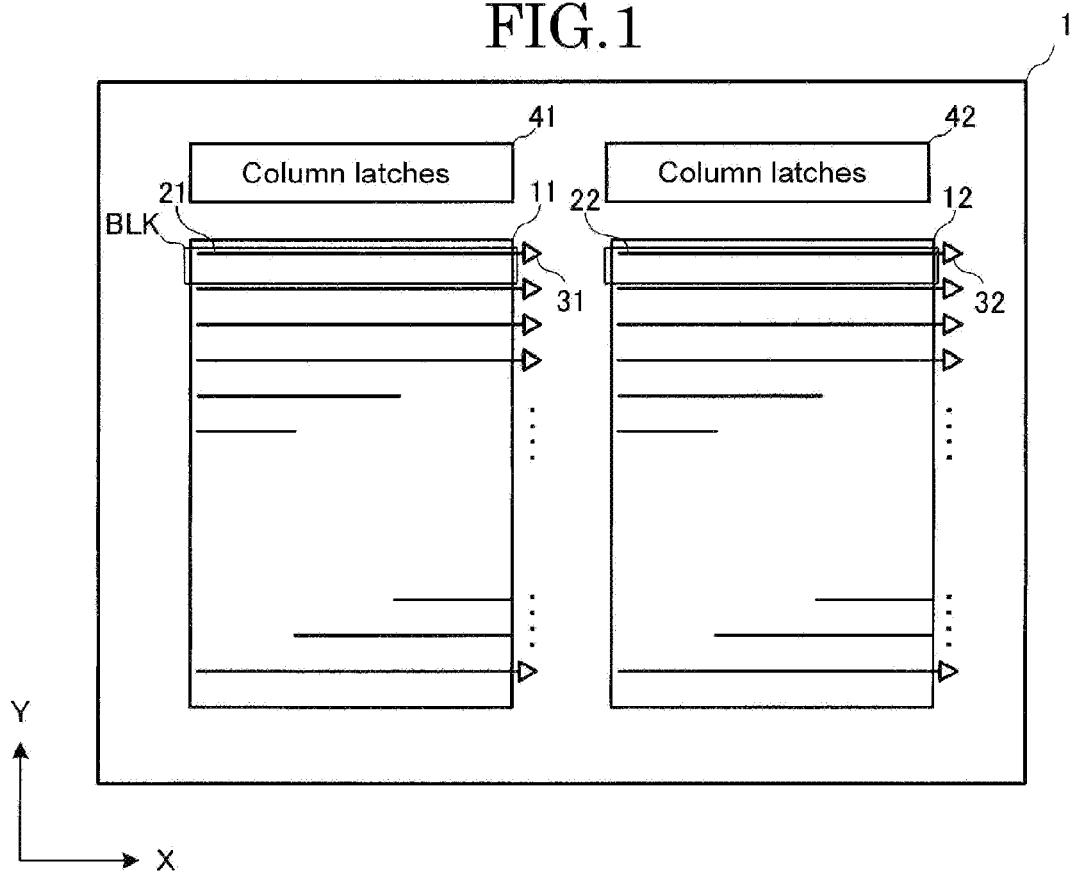
FIG. 1 shows a prior art configuration of a nonvolatile semiconductor memory.

The nonvolatile semiconductor memory devices can be configured by a NOR type array with 1 bit/cell operation with column latches, thereby enabling simultaneous programming of multiple bits as shown in the FIG. 1. In this example, the semiconductor chip 1 has two memory cell arrays 11 and 12. The each of the arrays has column latches 41 and 42 respectively. The each of the blocks BLK has a block source line 21 connected to a source line driver 31.

By assuming the programming time per one bit is 10 μsec and the number of bits for simultaneous programming (the capacity of the column latches) is 1 kbytes, the programming throughput of 100 Mbytes/sec can be realized. In this case, each of program verifications must be done within the 10 μsec cycle. When program verifications are done in bit-by-bit manner of reading cycle in, for example 100 nsec, program verification for 1 kbytes will take 800 μsec. Therefore, in order to complete a 1 kbyte programming operation within 10 μsec, it is necessary to perform simultaneous program verification for 1 kbytes. In addition to the column latches for latching data to be programmed simultaneously, circuits for parallel verification must be equipped.

Figure 2:
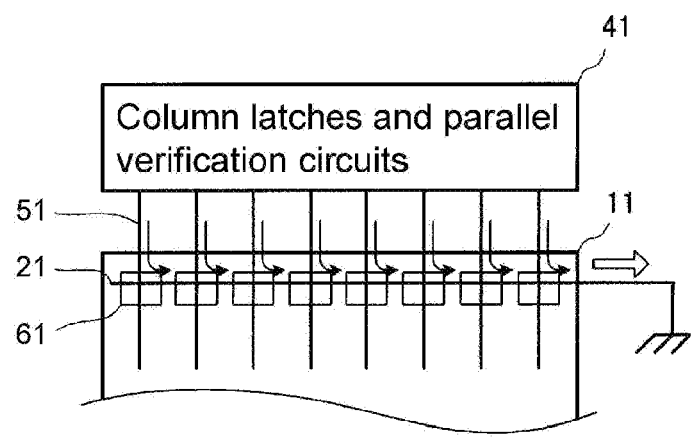
FIG. 2 shows a modification of the prior art nonvolatile semiconductor memory and current paths during operation.

FIG. 2 shows a relationship between the column latches with parallel verification circuits for performing parallel verifications, memory cells, source lines and bit lines. During verification, currents flow from the column latches 41 in the bit lines 51 and in the block source line 21. More specifically, the currents flow from the column latches to bit lines 51 and toward the block source line 21 (or in the inverse direction). In this example, one end of the block source line 21 is grounded.

Figure 3:
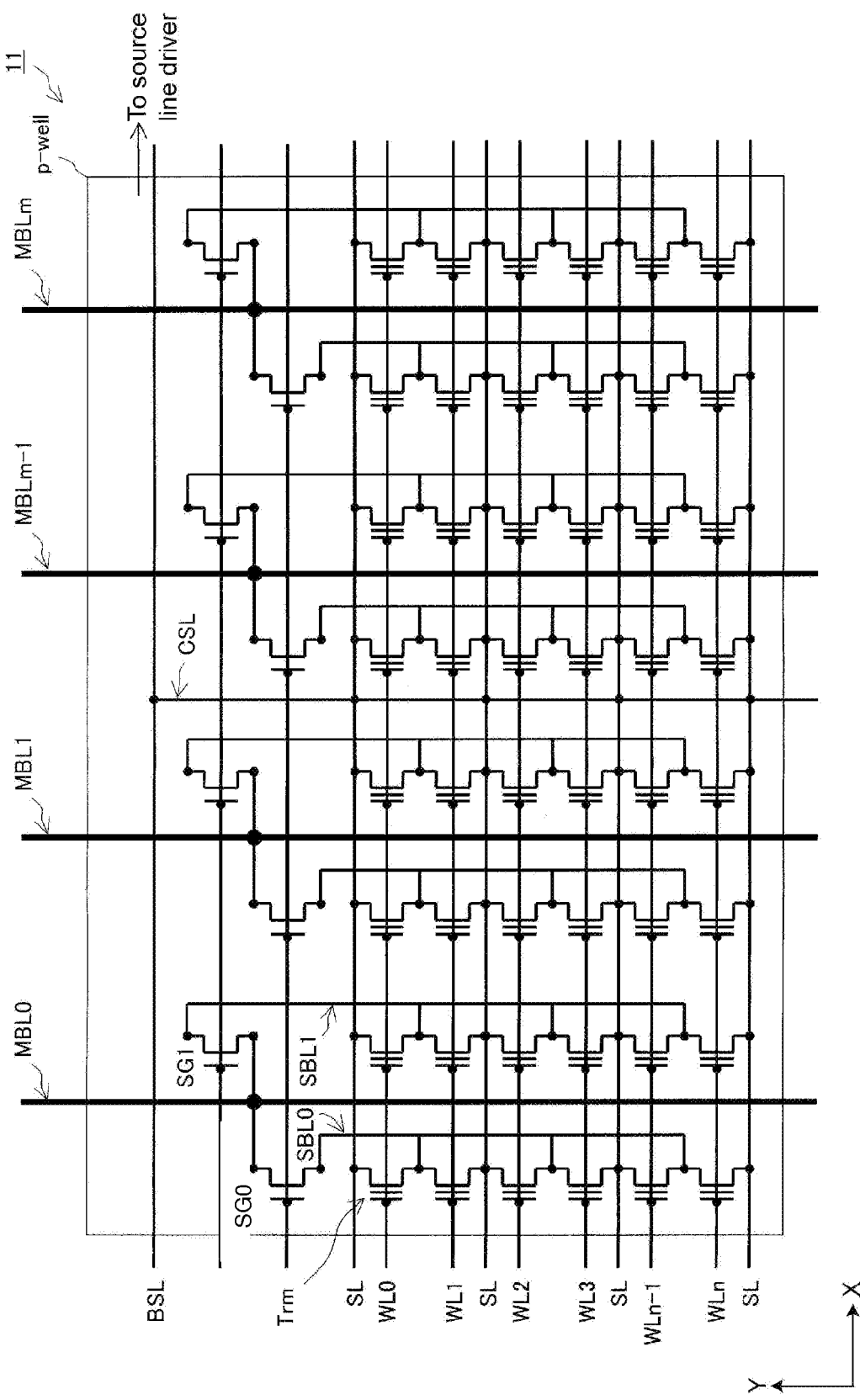
FIG. 3 shows a memory cell array of the modified nonvolatile semiconductor memory shown in the FIG. 2.

FIG. 3 shows a detailed configuration of the memory cell array 11. The memory cell array 11 is formed in a P-well and has NMOS type nonvolatile transistors Trm arranged and connected in NOR type. The matrix is of 2m (in word line direction X) by n (in bit line direction Y).

There are m Main bit lines MBL such as MBL0 to MBLm. Each of them is connected to two sub bit lines SBL0 and SBL1 by selection gates SG0 and SG1. The main bit lines MBL0-MBLm are connected to the column latches (including parallel verification circuits) described in the FIG. 2. The sources of the nonvolatile transistors Trm are commonly connected to the source lines SL extending in X direction.

The gates of the nonvolatile transistors are connected to word lines WL0-WLn extending in the X direction. Each of the source lines SL is connected to a corresponding column source lines CSL extending in the Y direction, and further connected to block source lines BSL extending in the X direction. The block source line BSL is connected to the source line driver 31 shown in the FIG. 1.

In the above nonvolatile semiconductor memory device, memory cell sources are commonly connected to the corresponding block source line BSL in block unit in order to perform block by block erasure.

Figure 4:
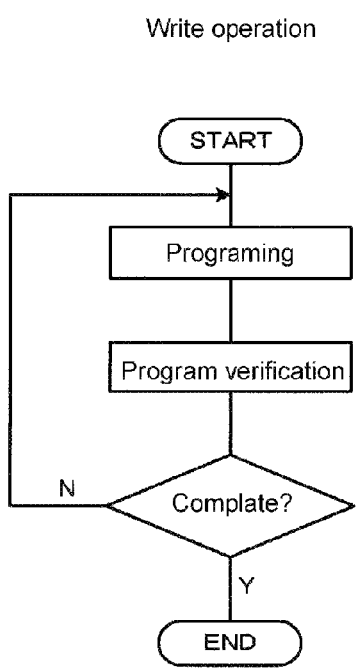
FIG. 4 shows a flow chart of programming operation.

When the above described parallel verification circuits are used, following problems occur during programming operation. FIG. 4 shows a flow chart of the whole sequence of programming operation. When the programming is done for the nonvolatile semiconductor memory device, the nonvolatile transistors are applied with a predetermined voltage, however because of the fluctuations of programming time of the memory cells (nonvolatile transistors), the total programming time is divided into plural repeating steps such as programming, program verification, and reprogramming to memory cells to which the programming is not yet completed. By the repeating steps, total programming operation is completed.

In order to reduce programming time, multiple bits must be simultaneously verified, and a large current which is a sum of read out currents following through memory cells into the block source line BSL must be flown. However, because the wiring resistance between the far end of each of the source line and the source line driver is high, there was a problem that required large current can not be flown within an allowable voltage drop.

Assuming 4 kbits of cells are simultaneously read out, even with read out current of 5 μA/bit, a large current of 20 mA total will flow. When the allowable voltage drop in the resistance is less than 100 mV, it is necessary to reduce the wiring resistance of the total path less than 5Ω. If the memory cell array region is about 5 mm×5 mm in size and the sheet resistance of the wire extending to the exterior of the memory cell array is 100 mΩ/square, a wire of about 100 μm is necessary. If this wire is arranged along with the word line direction, source lines of the width of 100 μm would be arranged along with the word line direction for each of the blocks of 4 k bit lines×128 word lines or 8 k bit lines×64 word lines. This is not realistic because the total source line wiring area exceeds the total memory cell array area.

Accordingly, it was required that a number of bits to be simultaneously verified must be reduced to restrict the current flowing through the source line, causing relatively long program verification time. Therefore, the total programming time is not reduced.

Figure 5A:
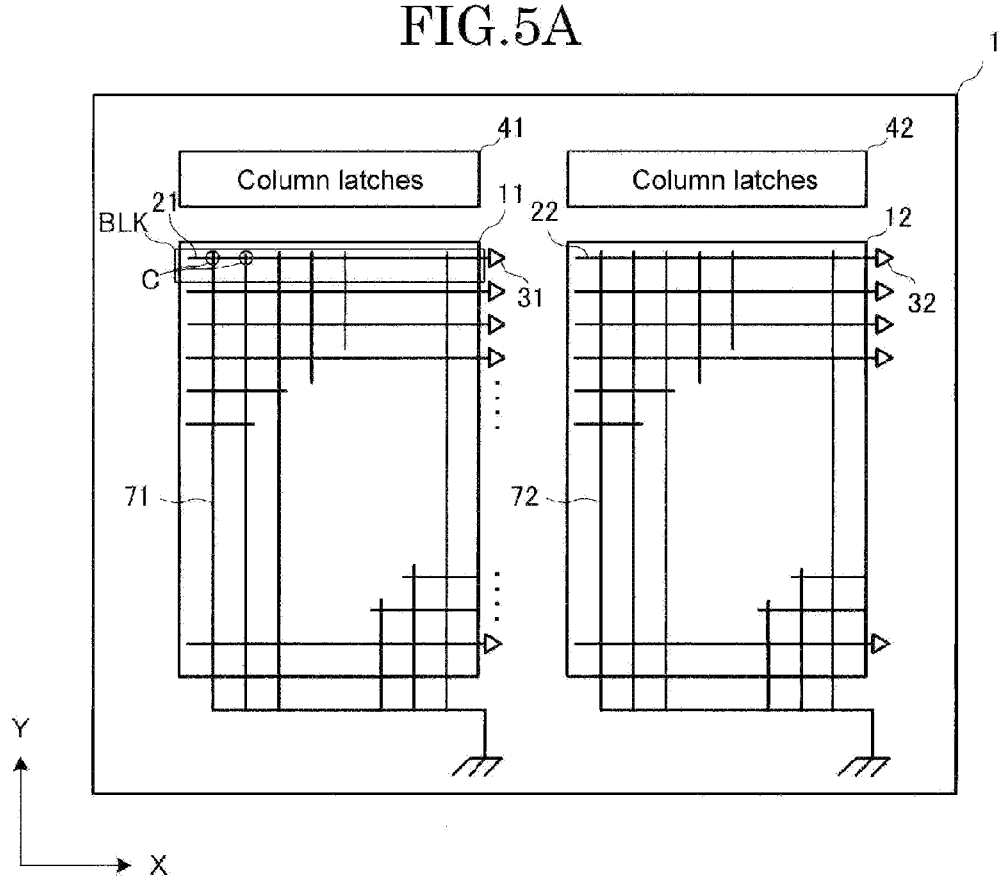
FIGS. 5A and 5B show a nonvolatile semiconductor memory device according to an embodiment of the present invention.
Figure 5B:
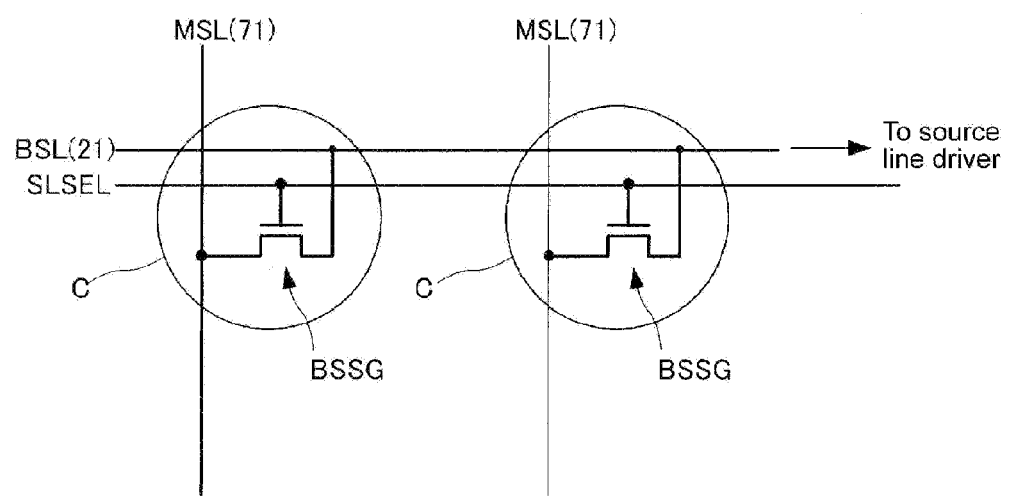

A nonvolatile semiconductor memory device according to an embodiment of the present invention will be described by referencing to the figures. FIG. 5A shows the whole configuration, and FIG. 5B is an enlarged view of the configuration for the area C in the FIG. 5A. Despite from the prior art nonvolatile semiconductor memory device shown in the FIG. 1, main block source lines 71 are arranged in the Y direction (bit line direction). Block source lines 21 and 22 are provided for each of the erasure block units. The global source lines 71, 72 are arranged in every 16-128 bit lines with the same intervals, and the one ends are connected to Vcc when P-channel nonvolatile memory cell is used or to Vss when N-channel nonvolatile memory cell is used. The global source lines MSL 71 and 72 and the block source lines (local source lines) BSL 21 and 22 are connected by the block source selection gates BSSG.

Figure 11:
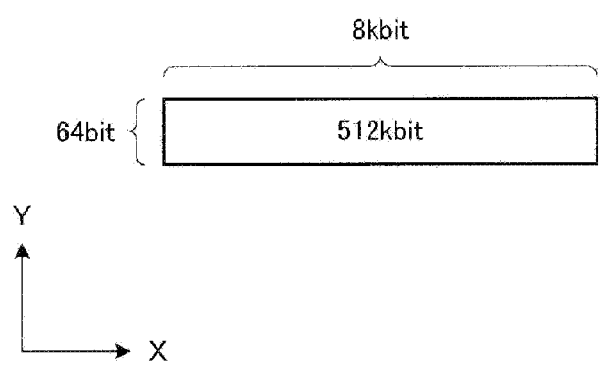
FIG. 11 shows a configuration of each of the block units.

FIG. 11 shows the configuration of each of the block units. The block is long in size along with X direction (word line direction) and short in size along with Y direction (bit line direction) because of the following reasons.

The size of industry standard block is 512 kbit/block or 1 Mbit/block.

When 10 μsec programming cycle (5 μsec for programming and 5 μsec for program verification) and 100 MB/s of programming speed are to be achieved, 1 kbytes of data should be programmed simultaneously. This means that 1 kbytes of bit lines are required for single block. As shown in the FIG. 11, a block unit consists of 512 k bit of 8 kbits along with the X direction and 64 bits along with the Y direction. Assuming 90 nm rule (F=90) is used and a single cell is of 3F X 3F, the length of the block along with the X direction is 2.2 mm and the width of the block along with the Y direction is about 17 μm.

Therefore, the block source lines 21, 22 will be long (not shorter than 2.2 mm) and the resistance and the voltage drop will be problems. These block source lines 21 and 22 are arranged for every block. When the widths of block source lines 21, 22 are broaden to reduce the resistance, the block width will increase in the Y direction. As described above, 100 μm of block source width is needed and 100 μm of wiring area for every 17 μm of blocks, which results in about seven times large block area (117/17≈17). This invention resolves this problem.

Figure 6:
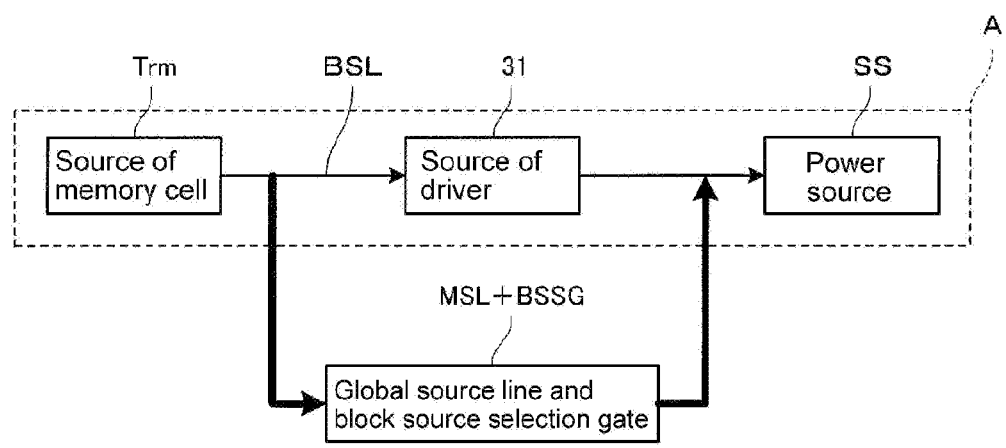
FIG. 6 shows paths of currents flown from the memory cells.

FIG. 6 shows paths of currents flown from the memory cells. The portion with dotted line A is the circuit equivalent to the conventional nonvolatile semiconductor memory. The cell current flows, during program verification, from the source of the memory cell Trm, to the block source line BSL, to the source line driver 31, and to the power source SS which may be the external power source Vcc or of ground (if N-channel memory cell is used).

In this embodiment, there is a by-pass from the source of the memory cell Trm to the power source SS. The by-pass is of the global source lines MSL and the block source selection gates BSSG. Each of the global source lines MSL, as described above, exists for every 16-128 bit lines. There are 512-64 global source lines in a block. Since the global source lines with the total width of 100 μm are sufficient for the predetermined resistance, a wiring area of 100 μm is added to the width of 2.2 mm, causing only 5% increase in area (0.01/(3.3+0.01)≈0.05). Therefore, the cell current flowing from the source of the memory cells Trm to the power source SS during simultaneous flows through the global source lines MSL and the block source selection gates BSSG, rendering a large current flows without voltage drop.

Figure 7:
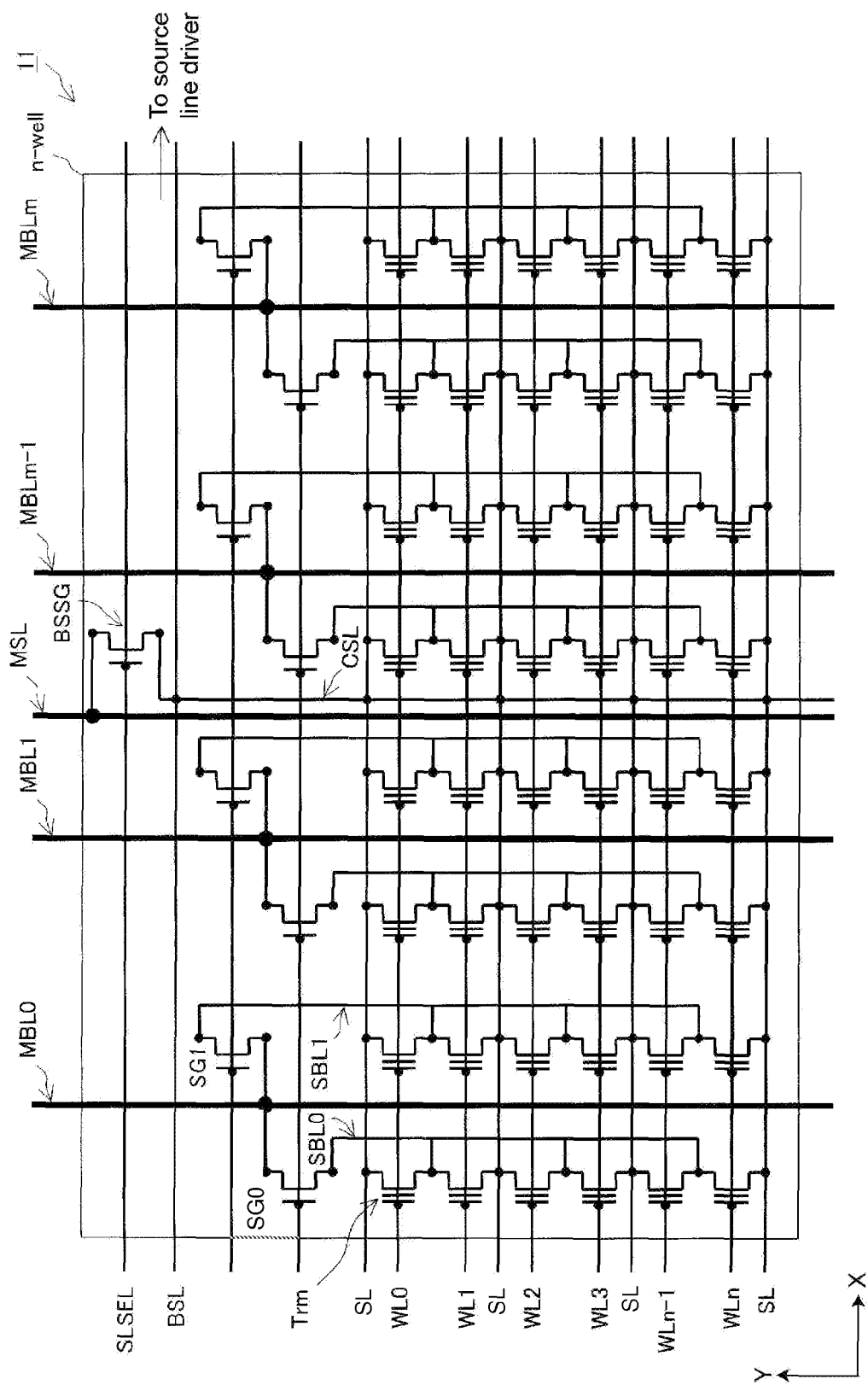
FIG. 7 shows a memory cell array of the embodiment of the present invention.

FIG. 7 shows a detailed configuration of the memory cell array 11. Different from the conventional nonvolatile semiconductor memory device shown in FIG. 3, nonvolatile memory cell transistor Trm, selection gates SG0 and SG1 and block source selection gates BSSG are formed in an n-well and the n-well is surrounded by a deep p-well. In this configuration, the nonvolatile transistors are electrically isolated from the semiconductor substrate, and making it capable to apply potentials to the n-well during programming and erasure, which leads to the improvement of the operation characteristics.

Other differences from the one shown in the FIG. 3 are that global source lines MSL are arranged in parallel to the main bit line MSL and the global source lines MSL and the block source lines BSL are connected by respective block source selection gates BSSG. Each of the global source lines MSL is arranged for every 8-64 main bit lines MBL. The block source selection gates BSSG are provided for independent n-wells which consist of different erasure blocks. The sub bit lines SBL0 and SBL1 are arranged in the first level metal layer, the source lines SL, the column source lines (block source lines) CSL are arranged in the second level metal layer, and the main bit lines MBL are arranged in the third level metal layer. The global source lines MSL are arranged in the same third level metal layer as the main bit lines MBL are. Other configuration is the same as the one shown in the FIG. 3.

As described above, the global source lines MSL can be arranged for every 8-64 main bit lines, which makes the overhead of the global source lines is only 5% increase in the memory array size. Therefore, the length of the block in the X direction does not expand a lot.

Figure 8:
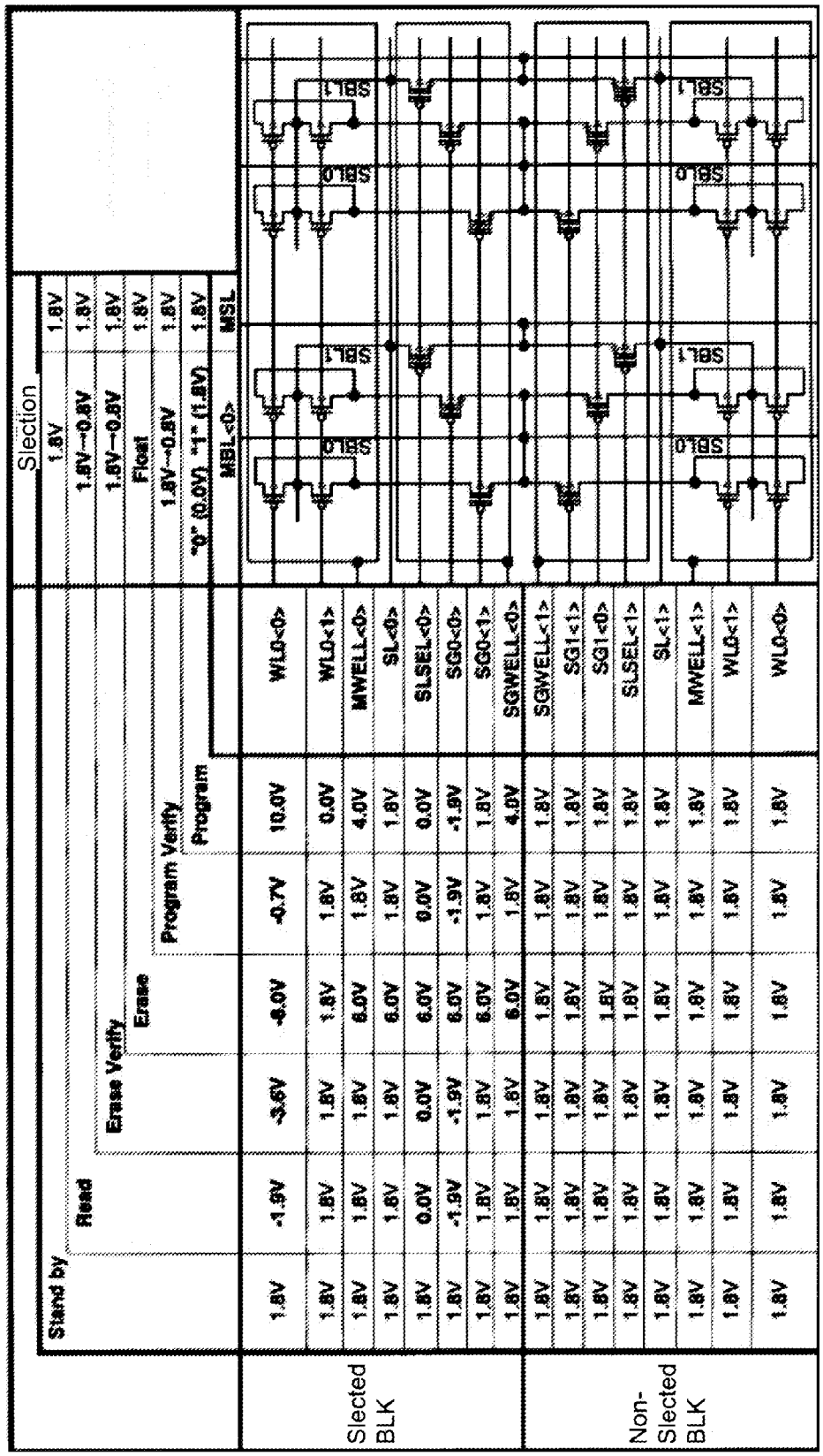
FIG. 8 shows a chart for voltages applied to various nodes during various operations.

FIG. 8 shows an example of voltage applications for various modes. In this chart, voltage applications to various nodes during stand-by, read, erasure verification, erasure, program verification and programming.

During programming, the well MWELL for the memory cells and the well SGWELL for the selection gates are supplied with 4.0V. Since those two wells are supplied with the same voltage, they can be combined in a single well. The word line WL0 connected to the selected memory cell is supplied with 10.0V, and the word lines WL0 connected to the non-selected memory cells are supplied with 0.0V. The source line SL is supplied with 1.8V (VCC), the selected selection gate SG0 is supplied with −1.9V, and non-selected selection gates are supplied with 1.8V (VCC). The main bit lines MBL are supplied with 0.0V for "0" programming and with 1.8V (VCC) for "1" programming. The global source lines MSL are always supplied with 1.8V (VCC).

During program verification, both of the well MWELL and the well SGWELL are supplied with 1.8V (VCC). The word line WL0 connected to the verified memory cell is supplied with −0.7V, and the word lines WL0 connected to the non-selected memory cells are supplied with 1.8V (VCC). The source line SL is supplied with 1.8V (VCC), the selected selection gate SG0 is supplied with −1.9V, and non-selected selection gates are supplied with 1.8V (VCC). The main bit lines MBL are supplied with 0.8V.

By referencing to the FIGS. 9 and 10, the programming and program verification operations of the NOR type nonvolatile semiconductor memory device shown in the FIG. 7 will be described.

Figure 10:
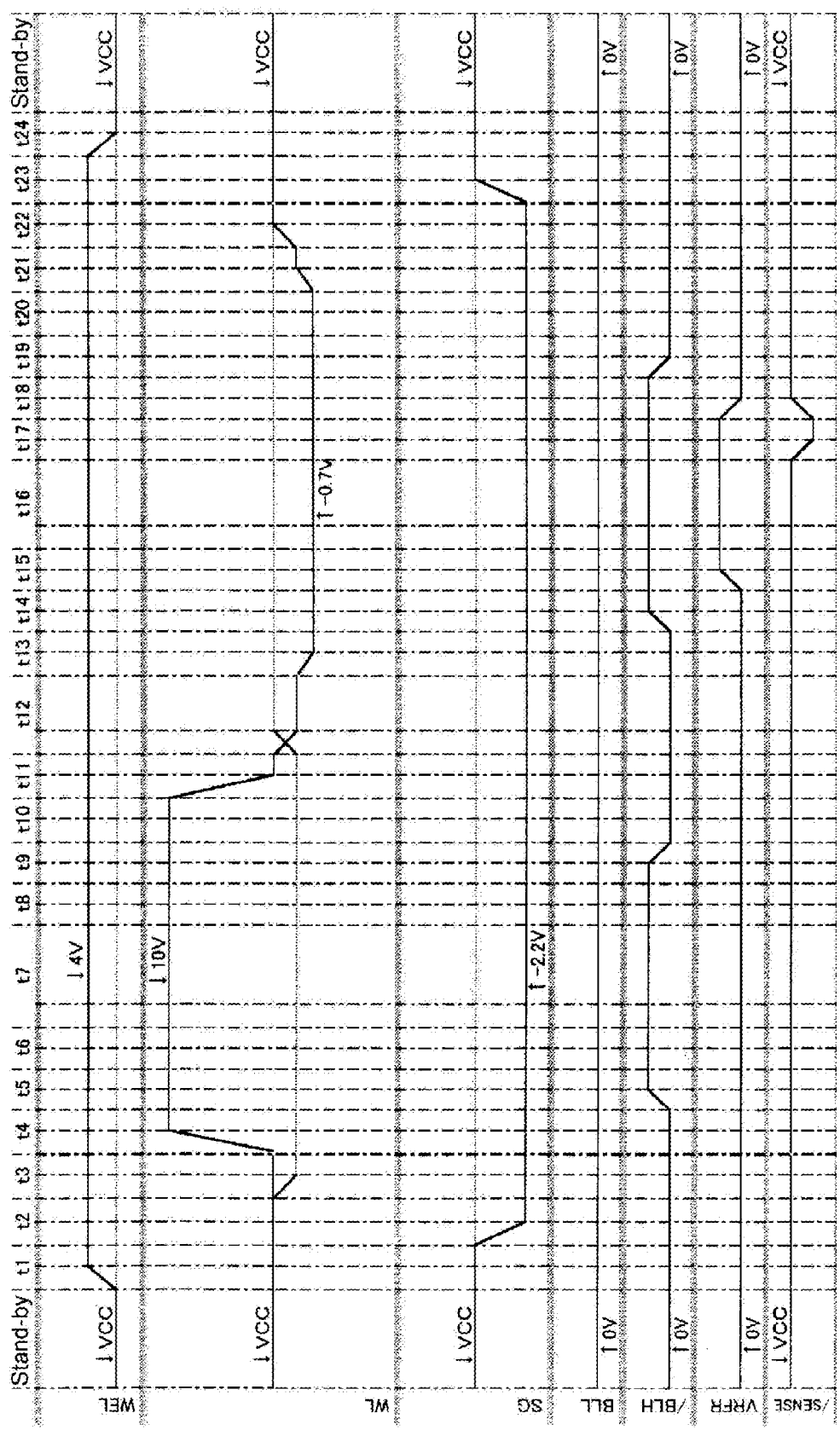
FIG. 10 shows a wave form chart during programming and program verification.

FIG. 10 shows a wave form chart showing the voltages applied to various nodes during programming and program verification. The symbols in the chart are referred as follows:
  MBL: Main Bit Line
  SG: Selection Gate
  SBL: Sub Bit Line
  WL: Word Line
  SL: Source Line
  WEL: Well (well for memory cell and well for selection gate)
  Programming Operation In this nonvolatile semiconductor memory device of PMOS nonvolatile cell formed in n-well, programming is done by using BBHE (Band to Band tunneling induced Hot Electron) injection. The BBHE injection is modified by applying relatively low voltage of 1.8V (VCC) compared to the well potential of 4.0V to the source, and applying 0.0V (VSS) to the drain, which renders the source/drain potential difference small enough to avoid punch through effect. Furthermore, an appropriate back gate potential (greater than VCC) is applied to effectively increase (the absolute value) the threshold voltage Vth, which further suppress punch through between source and drain. With the combination of relatively low voltage at source and appropriate back gate potential, punch through is effectively suppressed, which enables the gate length to be less than 0.1 μm, such as 60 nm.

The application of appropriate back gate voltage to the cell well enables bit lines to be supplied with GND-VCC, which renders fast operation during reading and programming. With this configuration, bit line control circuits can be made with high performance standard positive circuits supplied with Vcc.

Programming to the memory cell is done by injecting electrons into the charge trap layer of the memory cell. The electron injection is performed with BBHE injection by applying a 0.0V (ground) to the drain and applying positive voltage to the gate, thereby injecting electrons into the charge trap layer or floating gate.

MONOS type memory cell uses non-conductive nitride layer as the charge trap layer. The trapped electrons will not move within the trap layer and remains in the trapped location.

More specifically, as described using the FIG. 8, the cell wells (MWELL, SGWELL) is applied with the back gate voltage of +4V which is higher than VCC, and bit lines BL (in the configuration shown in the FIG. 7, bit lines are sectioned for every separate cell wells, therefore, main bit lines MBL) are supplied with a ground potential GND (=0V) or VCC (=1.8V). The word line WL is supplied with a gate potential VP of 10V. The source line SL is applied with VCC (=1.8V).

Figure 9:
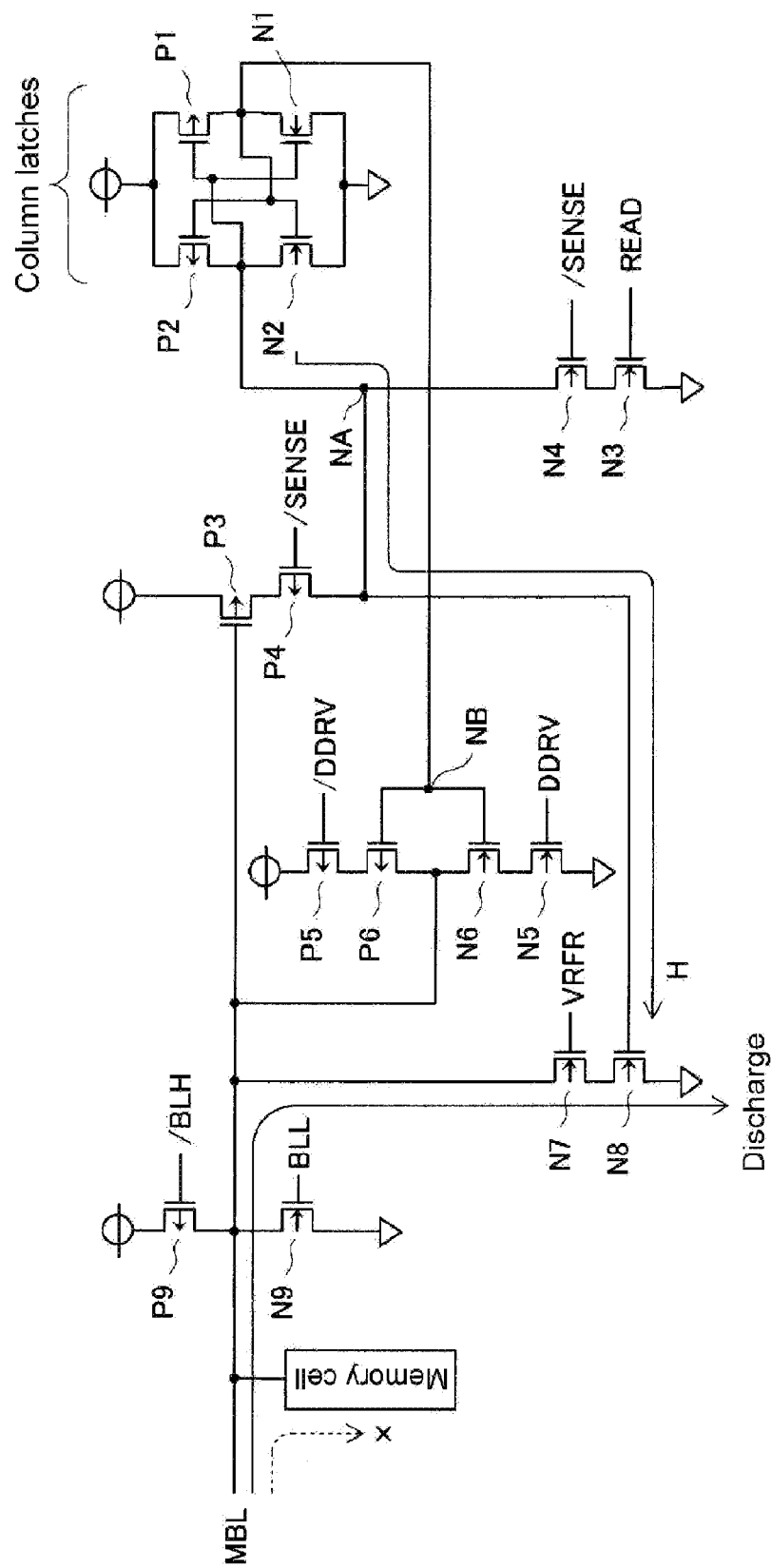
FIG. 9 shows a circuit diagram of the column latch circuit.

FIG. 9 shows a circuit diagram of the column latch circuit. FIG. 10 shows a wave form chart during programming and program verification with respect to various nodes in the circuit shown in the FIG. 9.

Firstly, the column latch circuit described in the FIG. 9 stores a program data. When the bit line is selected for programming (selected main bit line MBL), the node NA is "L" and the node NB is "H" while "L" is a low level (=GND) and "H" is a high level (=VCC). When the bit line is not selected for programming (non-selected main bit line MBL), NA="H" and NB="L".

Starting from Stand-by, at t1, the selected WEL is biased with 4V. This is done by activating a positive charge-pump circuit connected to the WEL driver circuit through a distributor circuit.

At the same time, at t1, the selection signal SLSEL for block source selection gate BSSG is biased with 0V.

At t2, the selected SG is biased with −2.2V. This is done by activating a negative charge-pump circuit connected to the SG driver circuit through a distributor circuit. With this operation, the selected SBL is connected to MBL and is charged at VCC.

At t3, non-selected WL is biased with GND. At t4, the selected WL is biased with 10V. This is done by activating a positive charge-pump circuit connected to the WL driver circuit.

At t5, /BLH is biased with "H", turning off the transistor P9 and rendering the MBL at "H" floating. At t6, DDRV is biased with "H" and /DDRV is biased with "L". This makes MBL be "L" (GND level) since the node NB="H". At the same time, non-selected bit line MBL is biased with "H" (VCC level) since the node NB="L".

At t7, the cell well of the selected memory cell is biased with 4V, the drain is biased with 0V, the gate is biased with 10V, and the source is biased with VCC (=1.8V).

By applying voltages as described, depletion layer appears at the junction boundary of the drain and the cell well, causing electron/hole pairs to be generated in the drain by Band to Band tunneling effect. These electrons are accelerated by a strong electrical field in the depletion layer and become high energy hot electrons, a part of which are injected into the charge trap layer or the floating gate by being attracted by the positive voltage applied to the gate electrodes.

At later half of t7, the above voltage condition (program pulse application) is kept and then applied voltages are released as following.

At t8, DDRV is biased with "L" and /DDRV is biased with "H", turning off the transistors P5 and N5. At t9, /BLH is biased with "L". By this operation, the selected MBL is returned to be biased with VCC.

At t11, the selected word line WL is biased with VCC. This is done by deactivating the positive charge-pump circuit connected to the WL driver circuit. At t12, the selected WL is grounded and non-selected word lines are biased with VCC. Program operation is complete.

Program Verification Operation

Program verification is done by confirming whether the threshold voltage of the target cell for programming is within the predetermined range. Therefore, the verification operation follows the program operation and those two operations are repeated.

In order to realize fast programming, it is necessary to switch the operation from programming to program verification and to perform fast verification operation. In the conventional technology, a cell well is biased with VCC during program verification, however, during programming operation above, the cell well is biased with a certain back gate voltage of 4.0V, making the switch from programming operation to verification operation takes time because the cell well with large capacity should be changed from 4.0V to VCC. Therefore, in this invention, the verification may be done while keeping the application of 4.0V to the cell well 12. During the verification operation, the cell well voltage is kept at 4.0V and the word line WL is biased with −0.7V. In this situation, the source line SL and the bit line MBL is charged to VCC and the source line SL is biased to GND. When programming is completed, then, the channel will be conductive and the bit line MBL is discharged to GND. When programming is not completed, then the bit line MBL is kept at VCC. The potential of the bit line MBL is latched at the column latch circuit and the next programming pulse application will be determined based on the latched data. Only when the latched potential is VCC, additional electron injection will be performed in the next program pulse application.

As described above, verification is done by keeping the same back gate voltage of 4.0V. Therefore, quick switch of program/verification can be done, realizing fast programming.

Program verification will be described by referencing to the FIG. 10. Firstly, at t13, the selected WL is biased with −5V. This is done by activating the negative charge-pump circuit connected to the WL driver circuit.

During verification, the cell well potential is kept at 4.0V and the word line WL is biased with −0.7V.

At t14, /BLH is biased with "H" and MBL is floated to "H" state. Next, at t15, VRFR is biased at "H". When NA is at "H", MBL is discharged to GND through transistors N7 and N8. The state where NA is at "H" is considered by the column latch to complete the programming operation, and the corresponding MBL is discharged though the transistors N7 and N8 and not through the programmed memory cell.

At t16, the selected SL is biased at GND. When programming is completed, the selected memory cell channel will be conductive and SBL and MBL are discharged. On the contrary, when programming is not completed, SBL and MBL remain at VCC.

At t17, /SENSE is biased at "L". When MBL is already discharged, then the transistor P3 is ON and the node NA is set to "H" notifying that the programming is completed. In this state, MBL will be at "H" at the next programming pulse application timing (t7), and not additional programming pulse will be applied to.

When MBL is not discharged and remains at "H", then the transistor P3 is OFF and the node NA remains at "L". In this state, MBL will be at "L" at the next programming pulse application timing (t7), and additional programming pulse will be applied to. The next programming pulse application will be determined based on the latched data.

At t18, VRFR is returned to "L" and /SENSE is returned to "H". At t19, /BLH is biased with "L". Therefore, at t20, MBL is returned to VCC.

At 21, the selected WL is biased with GND. This is done by deactivating the negative charge-pump circuit connected to the WL driver circuit.

The program verification operation is hereby completed. Then, the state of the column latch is checked. If the programming is completed, then the system proceeds to t22. If it is not completed, then the system returns to t3. The operations from t3 to t21 are repeated until program completion.

At t22, non-selected WL is biased with VCC. At t23, the selected SG is biased with VCC, which causes SBL and MBL be electrically isolated and SBL be floating.

At t24, the selected WEL is biased with VCC. This is done by deactivation the positive charge-pump circuit connected to the WEL driver circuit through the distributor circuit. The system returns to the stand-by state.

The above operation may be similar even when the cell well is applied with Vcc (1.8V) during program verification.

FIG. 12 shows a pattern of each of the block units. As shown in the figure, a plurality of global source lines (Main Source Lines) are arranged in parallel to the main bit lines MBL(1) to (m). Each of the blocks has a plurality of memory cells arranged in matrix, a plurality of word lines WL(1) to (n) connected to the gate electrodes of the memory cells arranged in the same row, a plurality of sub bit lines SBL(1) to (2m) connected to the drain electrodes of the memory cells arranged in the same column. The plurality of source lines SL are arranged in parallel to the word lines. The source lines are connected to the source electrodes of said memory cells in the same row. The plurality of local source lines LSL are arranged in parallel to the sub bit lines. Each of the plurality of local source lines is connected to the plurality of source lines. The plurality of bit line selection transistors are to connect selectively corresponding ones of the main bit lines and the sub bit lines. The plurality of block source selection transistors are arranged to selectively connect corresponding ones of the global source lines and the local source lines.

Each of the blocks has an independent well in which the plurality of memory cells and the plurality of block source selection transistors are formed. The well is of n-type well and the memory cells are of P-type nonvolatile memory cell transistors.

The detail of the circuit diagrams for the circuit to drive WL0, MWELL, SL, SLSEL, SG and SGWELL in FIG. 8 are disclosed in the patent application 11550335 filed on Nov. 17, 2006, of the same inventor, which is incorporated as a reference.

What is claimed is:

1. A nonvolatile semiconductor memory device comprising:
   a plurality of blocks (BLK) arranged in a first direction;
   a plurality of master bit lines (MBL0, MBL1, ... MBLm) extending in the first direction, the plurality of master bit lines being arranged across the plurality of blocks;

a plurality of column latches (P1, P2, N1, N2) connected to a respective one of the plurality of master bit lines, each of the plurality of column latches storing a readout data, the plurality of column latches being arranged in a second direction perpendicular to the first direction and in a periphery of the plurality of blocks; and a plurality of source line drivers (31), arranged in the first direction in a periphery of the plurality of blocks, wherein each of the plurality of blocks comprises:
   a row of a plurality of non-volatile memory cells arranged in the second direction, each of the non-volatile memory cells having a source, a charge trap layer, and a gate with a gate length less than 0.1 µm;
   a block source line extending in the second direction, the block source line being connected the source of all of the non-volatile memory cells and being connected to a corresponding one of the plurality of source line drivers (31); and
   a plurality of sub bit line groups, each of the sub lit line groups including a plurality of sub bit lines (SBL0, SBL1), the plurality of sub bit lines (SBL0, SBL1) being connected to a corresponding one of the non-volatile memory cells, and being selectively connected to a corresponding one of the plurality of master bit lines through selection gate transistors, each of the selection gate transistors being controlled by a selection line (SG0, SG1), wherein during program operation: sources of all of the plurality of non-volatile memory cells in the row are biased to a high voltage by a corresponding one of the source line drivers, and wherein during program verify operation, the sources of all of the plurality of non-volatile memory cells in the row are biased to a low voltage by the corresponding one of the source line drivers, thereby a program verification is performed to all of the plurality of non-volatile memory cells in the row in parallel.

2. The nonvolatile semiconductor memory device according to claim 1, wherein each of the plurality of master bit lines is connected to a discharge transistor (N8) to selectively discharge the plurality of master bit lines during the program operation, the discharge transistor being in response to a corresponding one of the column latches.

3. The nonvolatile semiconductor memory device according to claim 1, wherein the program verify operation is repeatedly performed.

4. The nonvolatile semiconductor memory device according to claim 1, wherein:
   the gate of the each of the non-volatile memory cells in the row is connected to a word line; and
   the word line is biased to a pumped voltage during the program operation by a positive charge pump circuit connected thereto.

5. The nonvolatile semiconductor memory device according to claim 1, wherein each of the non-volatile memory cells is a MONOS memory cell.

6. The nonvolatile semiconductor memory device according to claim 1, wherein the charge trap layer of each of the non-volatile memory cells is a non-conductive nitride film.

7. A nonvolatile semiconductor memory device comprising:

a plurality of blocks (BLK) arranged in a first direction;
a plurality of master bit lines (MBL0, MBL1, ... MBLm) extending in the first direction, the plurality of master bit lines being arranged across the plurality of blocks;
a plurality of column latches (P1, P2, N1, N2) connected to a respective one of the plurality of master bit lines, each of the plurality of column latches storing a readout data, the plurality of column latches being arranged in a second direction perpendicular to the first direction and in a periphery of the plurality of blocks; and
a plurality of source line drivers (31), arranged in the first direction in a periphery of the plurality of blocks,
wherein each of the plurality of blocks comprises:
   a row of a plurality of non-volatile memory cells arranged in the second direction, each of the non-volatile memory cells having a source, a charge trap layer, and a gate with a gate length less than 0.1 µm;
   a block source line extending in the second direction, the block source line being connected the source of all of the non-volatile memory cells and being connected to a corresponding one of the plurality of source line drivers (31); and
   a plurality of sub bit lines (SBL0, SBL1), each of the plurality of sub bit lines being connected to a corresponding one of the non-volatile memory cells, and being selectively connected to a corresponding one of the plurality of master bit lines through a selection gate transistor controlled by a selection line (SG0),
wherein during program operation: sources of all of the plurality of non-volatile memory cells in the row are biased to a high voltage by a corresponding one of the source line drivers, and
wherein during program verify operation, the sources of all of the plurality of non-volatile memory cells in the row are biased to a low voltage by the corresponding one of the source line drivers, thereby a program verification is performed to all of the plurality of non-volatile memory cells in the row in parallel.

8. The nonvolatile semiconductor memory device according to claim 7, wherein each of the plurality of master bit lines is connected to a discharge transistor (N8) to selectively discharge the plurality of master bit lines during the program operation, the discharge transistor being in response to a corresponding one of the column latches.

9. The nonvolatile semiconductor memory device according to claim 7, wherein the program verify operation is repeatedly performed.

10. The nonvolatile semiconductor memory device according to claim 7, wherein:
   the gate of the each of the non-volatile memory cells in the row is connected to a word line; and
   the word line is biased to a pumped voltage during the program operation by a positive charge pump circuit connected thereto.

11. The nonvolatile semiconductor memory device according to claim 7, wherein each of the non-volatile memory cells is a MONOS memory cell.

12. The nonvolatile semiconductor memory device according to claim 7, wherein the charge trap layer of each of the non-volatile memory cells is a non-conductive nitride film.

* * * * *